United States Patent [19]
Ferreira et al.

[11] Patent Number: 5,804,042
[45] Date of Patent: Sep. 8, 1998

[54] WAFER SUPPORT STRUCTURE FOR A WAFER BACKPLANE WITH A CURVED SURFACE

[75] Inventors: John Ferreira, Chester, N.Y.; Tatsuo Onozaki, Chiba; Hiroichi Ishikawa, Kanagawa, both of Japan

[73] Assignee: Tokyo Electron Limited, Tokyo, Japan

[21] Appl. No.: 488,063

[22] Filed: Jun. 7, 1995

[51] Int. Cl.[6] ................................................. C23C 14/34
[52] U.S. Cl. .................. 204/192.12; 204/192.32; 204/298.06; 204/298.15; 204/298.23; 204/298.34; 156/345; 118/723
[58] Field of Search ..................... 118/50.1, 728, 118/729; 156/345; 204/192.12, 192.32, 298.06, 298.15, 298.23; 216/58; 427/569

[56] References Cited

U.S. PATENT DOCUMENTS

| | | | |
|---|---|---|---|
| 4,261,762 | 4/1981 | King | 148/1.5 |
| 4,508,161 | 4/1985 | Holden | 165/1 |
| 4,944,860 | 7/1990 | Bramhall, Jr et al. | 204/298.15 X |
| 5,037,262 | 8/1991 | Moll et al. | 204/298.15 X |

*Primary Examiner*—Nam Nguyen
*Attorney, Agent, or Firm*—Wood, Herron & Evans LLP

[57] ABSTRACT

The wafer support structure is used with a movable backplane having a curved upper surface which is moved between a wafer access position and a wafer process position to clamp a wafer against a clamping structure during processing. A guide ring surrounds the backplane and a floating ring is spring-mounted on the guide ring by flat, elongated lift springs. RF bias springs are positioned on top of the floating ring along with wafer support pins which support a wafer above the curved backplane surface. When the backplane is moved toward the clamping structure to clamp the wafer, the RF bias springs make electrical contact with a portion of the clamping structure, and the clamping structure acts against the floating ring to flex the lift springs and lower the floating ring such that the wafer is transferred to the backplane surface to be clamped against the clamping structure. When the wafer is clamped, the support pins are out of contact with the wafer. The wafer is stably supported by the support pins over the backplane surface during access of the wafer and is securely clamped between the backplane and clamping structure away from the wafer support during processing of the wafer. A filler ring around the backplane reduces formation of a secondary plasma.

38 Claims, 4 Drawing Sheets

WAFER SUPPORT STRUCTURE FOR A WAFER BACKPLANE WITH A CURVED SURFACE

FIELD OF THE INVENTION

The present invention relates generally to support of a semiconductor wafer over a curved processing backplane and, specifically, to a movable wafer support which moves away from the wafer during processing when the backplane clamps the wafer against a clamping structure.

BACKGROUND OF THE INVENTION

In the formation of integrated circuits, semiconductor wafers are cycled through a variety of different process steps, including sputter deposition, chemical vapor deposition, de-gassing and/or sputter etching. In some wafer processing apparatuses, the wafer is placed horizontally over a wafer backplane which is moved into position against a wafer clamping structure to clamp the wafer to the backplane in a processing chamber. During automated processing of a semiconductor wafer using such a processing apparatus, a wafer-handling robot must have access to the wafer to transfer wafers onto and off of the backplane and between various processing chambers. Accordingly, the wafer backplane is vertically movable with respect to the processing chamber to allow access to the wafer, and the backplane has a lowered, access position for the wafer-handling robot to access the wafer and a raised, process position whereupon the backplane is moved against the wafer clamping structure to securely clamp the wafer between an upper surface of the backplane and the clamping structure. When the backplane is in the raised, process position, the processing chamber is generally sealed so that the wafer may be processed in a low pressure environment.

Figure 1:
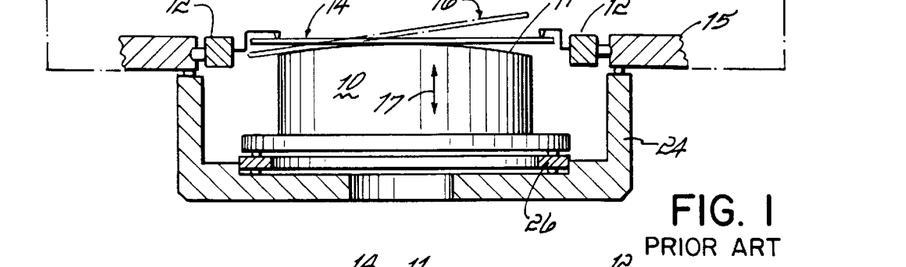
FIG. 1 is a schematic side view, in partial cross-section, of a wafer clamping structure showing a curved backplane surface.

For some processing, the wafer backplanes are heated and have upper support surfaces which are curved in shape so that heat transfer between the wafer and the backplane is more efficient. For example, U.S. Pat. No. 4,508,161 provides an example of a backplane with a curved upper surface. On a curved backplane surface, an unclamped wafer is supported only at a centerpoint. When the wafer backplane moves vertically to clamp the wafer within the processing chamber, the wafer has a tendency to slip to the side of the backplane due to its unstable balance on the centerpoint of the curved surface. FIG. 1 schematically illustrates a wafer backplane 10 with a curved upper surface 11 and a clamping structure 12 for securing a wafer 14 within a processing chamber 15. Preferably, the wafer 14 is clamped between the backplane surface 11 and clamping structure 12 in a generally horizontal position as shown. However, as illustrated in phantom by wafer 16, when the wafer is unclamped and backplane 10 is moved vertically in the direction of arrow 17 to clamp wafer 14, the wafer tends to tilt and slide to one side or the other of the curved upper surface 11 of backplane 10. This prevents proper clamping of the wafer during processing and may damage the wafer.

Figure 2:
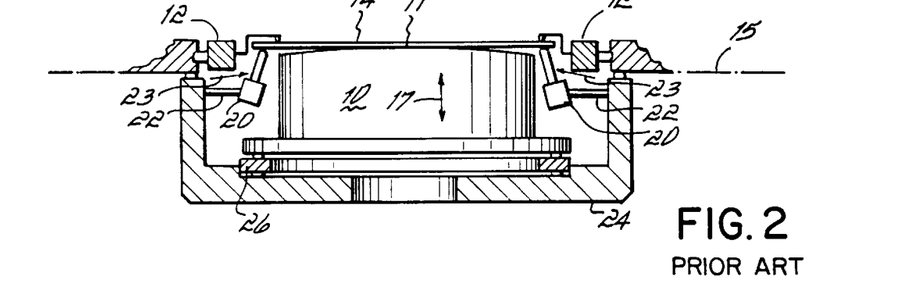
FIG. 2 is a schematic side view of the clamping structure of FIG. 1 including conventional wafer supports.

To prevent such slippage, wafer supports have been developed to support the wafer while it rests on the backplane in the access position, that is, when the backplane is lowered away from the clamping structure to allow access to the wafer. One typical wafer support structure utilizes support pins at various positions around the backplane. Referring to FIG. 2, support pins 20 are connected to support pin springs 22 which allow vertical movement of the pins 20 relative to the wafer backplane 10, or relative a seal cup 24 which moves the backplane 10. When the backplane 10 is in the access position and lowered away from the clamping structure 12, the pins 20 support the outside edges of wafer 14 and thereby prevent tilting of the wafer on the curved upper surface 11. When backplane 10 is moved vertically from the access position to the process position, pins 20 maintain the wafer generally horizontal.

However, the support pins 20 have several drawbacks. For example, when wafer 14 is clamped between surface 11 and the clamping structure 12, the pins 20, which are supported on relatively short pin springs 22, move downwardly and also vertically in the direction of arrows 23 across the bottom surface of wafer 14. The pins thereby scrape the bottom surface of wafer 14 and generate particles which may contaminate the process within the chamber 15. Furthermore, pins 20 are spring loaded and remain in contact with wafer 14 during processing. Some processes require very high temperatures or create deposition materials around the support pins 20, thereby causing the pins to stick to wafer 14. When the support pins 20 stick to the wafer, the wafer moves to an undesirable position on the backplane when the backplane 10 is lowered from the process position to the wafer access position. Furthermore, the wafer-handling robot may have difficulty removing the wafer from the support pins and backplane, thereby damaging the wafer.

Therefore, it is an objective of the present invention to provide support of a wafer on a curved backplane surface which prevents slippage of the wafer when the backplane is moved between an access and a process position in a process chamber. It is another objective to provide such wafer support without generating contaminating particles in the chamber or producing adherence of the wafer to the support.

Figure 3:
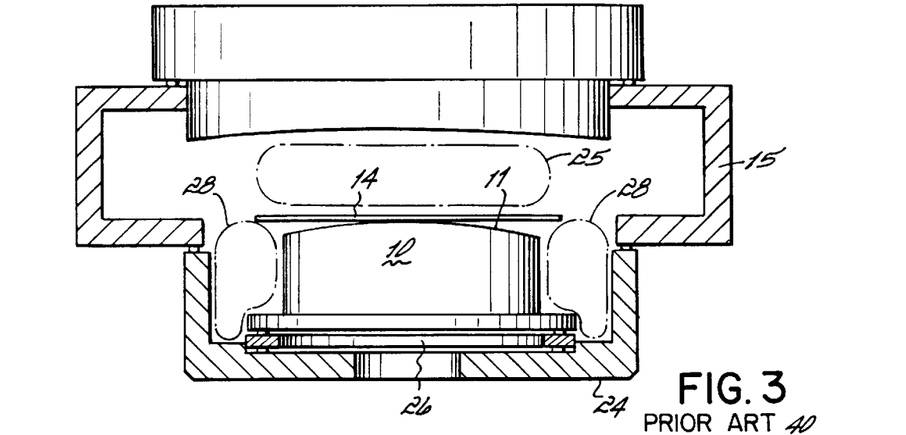
FIG. 3 is a schematic side view, in partial cross-section, of a processing chamber illustrating a secondary plasma.

An additional drawback to existing processing chambers is the existence of a secondary plasma around the backplane which interferes with the process plasma. More specifically, in an RF sputtering or etching process, a process plasma 25 of ionized gas particles is utilized. To create such a plasma, the electrical potential of the wafer backplane 10 is different from the potential of the seal cup 24 which supports and moves the backplane. Referring to FIG. 3, the backplane 10 is biased by a power source (not shown) and the seal cup 24 is separated from the backplane 10 by an insulator ring 26 and is usually held at ground potential. When there is a certain amount of space between the biased backplane 10 and the seal cup 24, a secondary plasma develops between the wafer backplane 10 and the seal cup 24, as illustrated by secondary plasma 28 in FIG. 3. Such a secondary plasma is undesirable because it affects the process plasma 25 and adversely affects the sputtering within chamber 15.

One way of eliminating the secondary plasma is to reduce the space between the backplane and the element at ground potential, i.e., the seal cup. When the space is small, the accelerated electrons do not collide with a gas molecule, and therefore, a secondary plasma is not created. In order to reduce the space, a dark space shield or filler ring (not shown in FIG. 3) is often utilized around the backplane and is biased at the same potential as the backplane. However, in utilizing conventional wafer supports around the backplane, it has been necessary to position the support pins between the filler ring and the backplane, thereby making it difficult to reduce the space around the backplane to eliminate the undesirable secondary plasma. Therefore, it is the objective of the present invention to support a wafer on a curved backplane while reducing or effectively eliminating the secondary plasma around the backplane.

SUMMARY OF THE INVENTION

The above-discussed and other objectives are accomplished by a wafer support structure which stably supports the wafer above a curved backplane surface when the wafer is not clamped between the backplane surface and a clamping structure. The wafer support structure is operable to transfer the wafer to the curved surface and to then move away from and out of contact with the wafer when the backplane is moved vertically to clamp the wafer. The wafer support structure of the invention is assembled and utilized with a processing chamber having a movable backplane and a wafer clamping structure. The backplane has a wafer process position in which the backplane is held against the clamping structure to clamp a wafer therebetween during processing, and a wafer access position in which the backplane is spaced away from the clamping structure and the processing chamber to allow access to the wafer, such as by an automated wafer-handling robot.

The wafer support structure surrounds the backplane which is preferably cylindrical in shape with a circular upper surface to support a circular wafer. The support structure comprises a circular stationary guide ring which is positioned around the backplane, generally concentrically therewith, and is fixed to the movable backplane assembly such that the guide ring moves with the backplane toward and away from the clamping structure.

To support the wafer above the backplane upper surface when the wafer is not clamped, a circular floating ring is movably mounted on top of the stationary guide ring and includes a plurality of support pins positioned around the floating ring periphery. The pins extend vertically upwardly from the upper surface of the floating ring and support the wafer above the floating ring at several points around the wafer. The floating ring surrounds the wafer backplane and is positioned generally concentrically with the backplane and the stationary guide ring. The floating ring is spring-mounted on the guide ring to be vertically movable toward and away from the guide ring as the backplane moves between the access and process positions.

The vertical movement of the spring-mounted floating ring raises and lowers the wafer support pins and the wafer with respect to the backplane surface as the backplane is moved. When the backplane is in the access position and the wafer is not clamped, the floating ring is in a raised position and the wafer is stably supported over the backplane. The curvature of the backplane surface does not interfere with the stability of the wafer because the wafer does not contact the surface. When the backplane is moved to the process position to clamp the wafer, the spring-mounted floating ring is operable to move to a lowered position against the guide ring. As the floating ring is lowered, the support surface of the wafer support pins moves below the curved backplane surface thus transferring the wafer to the backplane surface. The movement of the floating ring with respect to the movement of the backplane is preferably coordinated such that the wafer is transferred to the backplane just as it is beginning to be clamped between the backplane and clamping structure. As the backplane continues to move vertically upward, the wafer is clamped against the clamping structure and the floating ring and support pins are lowered until the floating ring and pins are spaced away from and out of contact with the wafer and below the wafer. Therefore, when the backplane is in the access position, the wafer is stably supported over the backplane surface by the floating ring and support pins. However, when the backplane is moved into the processing position, the wafer is clamped away from the floating ring and support pins.

In a preferred embodiment of the invention, the floating ring is spring-mounted on top of the stationary guide ring by three elongated, flat, arcuate-shaped lift springs. The flat springs are generally horizontally oriented and are positioned between the guide ring and the floating ring with one end of each lift spring connected to a top surface of the stationary guide ring and the other end connected to the bottom surface of the floating ring. The arc curvature of the lift springs preferably follows the arc curvature of the circular guide ring and floating ring such that the lift springs are effectively sandwiched between the rings. The elongated lift springs are dimensioned in length to extend around a large portion of the floating ring circumference to ensure smooth movement of the floating ring.

When the backplane is in the access position, the lift springs are unflexed and the floating ring is held in the raised position, spaced above the guide ring with the wafer supported horizontally above the backplane. When the backplane is moved to the process position to clamp the wafer, the floating ring contacts a surface of the clamping structure and is moved downwardly. The clamping structure pushes the floating ring downwardly against the bias of the lift springs, thus lowering the support pins and wafer and transferring the wafer from the support pins to the backplane surface. In the process position, the support pins are not touching the backside of the wafer, and the wafer is clamped between the clamping structure and the backplane surface. With the floating ring held down, the clamping structure does not have to act against the force of the lift springs.

The elongated lift springs around the floating ring ensure that the support pins experience very little lateral movement when the floating ring is lowered and the lift springs flex. Therefore, particle generation traditionally resulting from the wafer supports scraping the back side of the wafer is effectively eliminated. In a preferred embodiment, a coiled stabilizer spring is positioned between the guide ring and the floating ring proximate each attachment point of a lift spring to the floating ring to stabilize the movement of the floating ring as it is raised and lowered and to prevent bouncing of the floating ring.

A filler ring also surrounds the backplane and is dimensioned in diameter to fit inside the inner diameter of the stationary guide ring. The filler ring moves with the guide ring and fills the space between the backplane and the guide ring to prevent formation of a secondary plasma in the space during processing. Preferably all of the rings of the support structure and the seal cup are stainless steel because they are exposed to the processing environment and should be generally able to withstand corrosion.

Therefore, the wafer support structure of the present invention stably supports the wafer in the access position so that it does not slip on the curved upper surface of the wafer backplane. Furthermore, particle generation is effectively eliminated because of the limited lateral movement of the support pins. Since the floating ring is moved by springs and is raised and lowered by the vertical motion of the backplane, no dedicated actuator is necessary for movement of the wafer support structure, thereby reducing the cost and complexity of the support structure. Still further, the support pins are moved away from and out of contact with the wafer after it is clamped prior to processing. Thus, the support pins will not stick to the wafer during processing. The design of the wafer support structure and the use of the filler ring ensures that any gaps around the floating ring are small to reduce secondary plasmas around the backplane, thus improving the process reliability and increasing the useful life of the lift springs for a more reliable wafer support structure. These advantages and the other advantages will become more readily apparent from the brief description of the drawings and the detailed description of the invention below.

BRIEF DESCRIPTION OF THE DRAWING

The accompanying drawings, which are incorporated in and constitute a part of this specification, illustrate embodiments of the invention, and together with a general description of the invention given above, and the detailed description of the embodiments given below, serve to explain the principles of the invention.

DETAILED DESCRIPTION OF SPECIFIC EMBODIMENTS

Figure 4A:
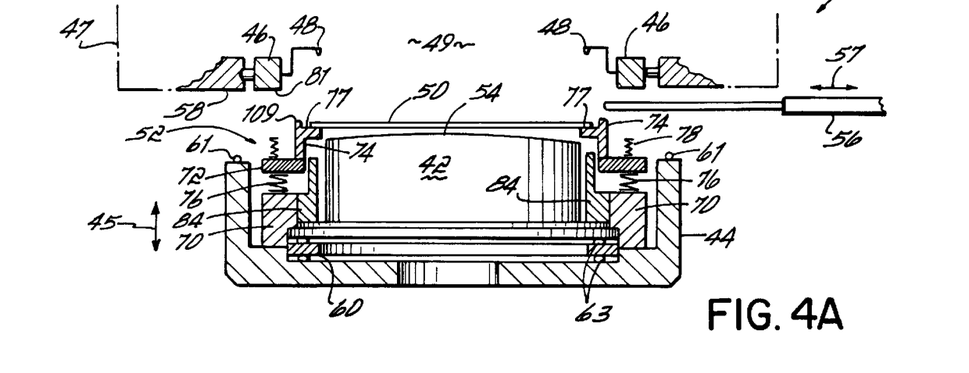
FIG. 4A is a schematic side view, in partial cross-section, of the wafer support structure of the invention with the backplane in the wafer access position.
Figure 4B:
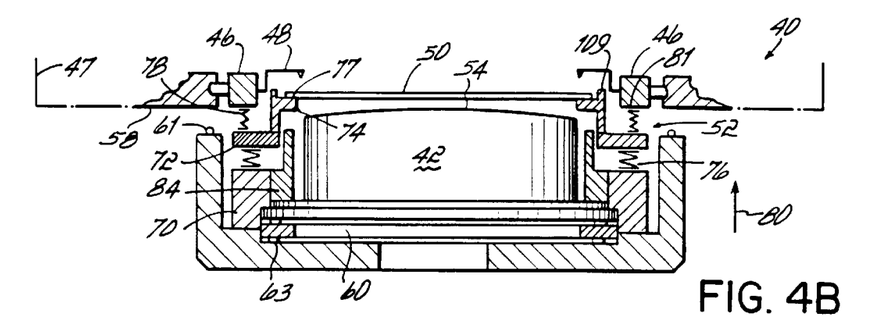
FIG. 4B is a schematic side view, in partial cross-section, of the wafer support structure of FIG. 4A with the backplane being moved between the wafer access position and the wafer process position.
Figure 4C:
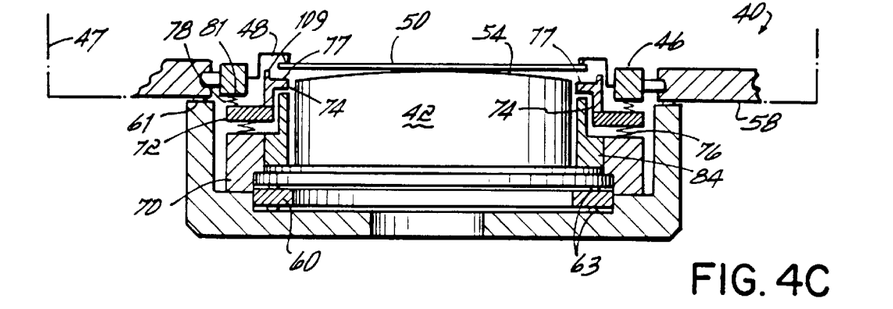
FIG. 4C is a schematic side view, in partial cross-section, of the wafer support structure of FIG. 4A with the backplane in the wafer process position.

One embodiment of the wafer support structure of the present invention, as utilized with a wafer backplane and clamping structure, is illustrated schematically in FIGS. 4A, 4B and 4C. Specifically, the wafer support assembly 40 includes a generally cylindrical wafer backplane 42 which is carried within a cylindrical seal cup 44 and is moved vertically in the direction of arrow 45 by an air cylinder 130 (see FIG. 7). Seal cup 44 moves the backplane 42 toward and away from the clamping structure 46, which includes a plurality of spring-biased clamping arms 48, and toward and away from the processing chamber 47 and processing space 49. A wafer 50 is supported by the wafer support structure 52 of the invention which surrounds backplane 42 and supports the wafer 50 above a generally circular and curved upper surface 54 of backplane 42 when the backplane and seal cup are positioned in an access position as illustrated in FIG. 4A. In the access position, the seal cup 44, the backplane 42 and the wafer support structure 52 are vertically lowered and spaced away from the clamping structure 46 and processing chamber 47 so that wafer 50 may be accessed, such as by an automated wafer-handling robot mechanism 56 which moves generally horizontally in the direction of arrow 57, in order to remove and insert wafers in the processing chamber 47. As illustrated in FIG. 4A, backplane 42 and wafer support structure 52, as well as wafer clamping structure 46, are parts of a processing chamber 47 which performs a specific process on wafer 50, such as sputter etching. Seal cup 44 has a seal gasket 61 around its perimeter such that when the seal cup is moved vertically to clamp wafer 50 between the backplane surface 54 and the clamping structure 46, as illustrated in FIG. 4C, the seal gasket 61 seals against the lower surface 58 of chamber 47. Seal gasket 61 ensures that the processing chamber 47 and processing space 49 are effectively sealed with an air-tight seal when the backplane 42 and wafer are in the process position so that processing space 49 may be vacuumed to low pressure if desired.

For various wafer processing methods, the backplane 42 is electrically biased in order to bias wafer 50. A ceramic insulator ring 60 is positioned between the bottom surface of backplane 42 and the seal cup 44 to prevent biasing of the seal cup. Appropriate seals 63 are positioned between the insulator ring 60, the backplane 42 and the seal cup 44 to maintain the air-tight seal of the processing chamber 47.

The wafer support structure 52 of the invention comprises a stationary guide ring 70 and a vertically movable floating ring 72 which is spring-mounted on guide ring 70 by lift springs 76 and is positioned to move generally above stationary guide ring 70. Stationary guide ring 70 and floating ring 72 surround backplane 42. Floating ring 72 includes a wafer support, and more specifically, includes a plurality of wafer support pins 74 at various positions around the perimeter of floating ring 72 (see FIG. 5). The support pins support wafer 50 above the curved upper surface 54 of backplane 42 when backplane 42 is in the access position as illustrated in FIG. 4A. In accordance with the principles of the invention, the spring-mounted floating ring 72 moves downwardly against stationary guide ring 70 when the backplane 42 is moved vertically against the clamping structure 46 to clamp wafer 50 between the clamping structure and the backplane.

Figure 5:
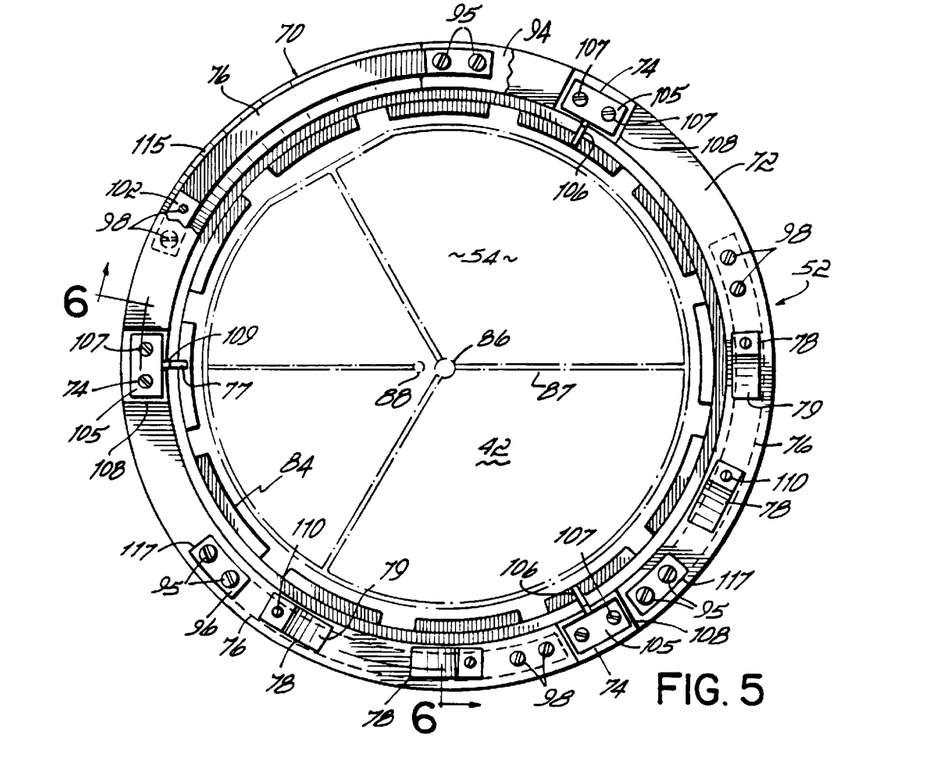
FIG. 5 is a top view, partially cut away, of a preferred embodiment of the wafer support structure of the present invention.

As illustrated schematically in FIGS. 4A, 4B and 4C, floating ring 72 is supported above the stationary guide ring 70 by lift springs 76 which are positioned at various positions around the circumference of stationary guide ring 70 (see FIG. 5). The lift springs 76 act against a bottom surface of floating ring 72 and hold the floating ring suspended above the stationary guide ring 70 which maintains the wafer support surface 77 of the support pins 74 above the curved upper surface 54 of the backplane 42 to support wafer 50 horizontally thereabove. A plurality of RF bias springs 78 are positioned on the top surface of the floating ring 72 and engage a surface of the clamping structure 46 for proper RF biasing of the clamping structure.

As illustrated in FIG. 4A, when the backplane 42 is in the wafer access position, floating ring 72 and RF bias springs 78 are spaced below the clamping structure 46. However, the RF bias springs 78 abut against the wafer clamping structure 46 as the backplane 42 is moved into the wafer process position as illustrated in FIG. 4B. The lift springs 76 and RF bias springs 78 are illustrated as coil springs in FIGS. 4A, 4B, and 4C. However, in a preferred embodiment of the invention, the springs 76, 78 are flat springs as discussed in greater detail hereinbelow.

FIGS. 4B and 4C schematically illustrate the operation of the wafer support structure 52 of the present invention when backplane 42 is moved between the wafer access position (FIG. 4A) and the wafer process position (FIG. 4C). Specifically, when the seal cup 44 is moved vertically upward in the direction of arrow 80, the RF bias springs 78 contact the lower surface 81 of the clamping structure 46. The RF bias springs 78 are then compressed or flexed between surface 81 and the floating ring 72 as the seal cup 44 continues its upward vertical movement. The RF bias springs are compressed and collapse into grooves 111 formed in floating ring 72 (see FIG. 6B). When the RF bias springs 78 are compressed, an upper surface 83 of floating ring 72 and a surface 83 of the pins 74 contact the lower surface 81 of the clamping structure 46 to drive the floating ring and the wafer support pins 74 downwardly (FIG. 4C). As the floating ring 72 is moved downwardly toward stationary guide ring 70, the lift springs 76 are also compressed. Accordingly, floating ring 72 and the lift pins 74 are driven vertically downward as the backplane moves vertically upward to clamp wafer 50 between curved backplane surface 54 and the clamping arms 48.

As illustrated in FIG. 4C, when seal cup 44 and backplane 42 have been moved into the process position, wafer 50 is clamped between arms 48 and backplane surface 54 and the seal cup 44 is sealed against the processing chamber 47 by seal gasket 61. In the process position, floating ring 72 has been driven downwardly very close to stationary guide ring 70 thus moving the support surface 77 of pins 74 below surface 54 and away from the wafer 50 so that during processing, the wafer support pins 74 do not contact wafer 50. Therefore, when backplane 42 is in the access position, wafer 50 is stably supported above backplane 42 and thus will not rock on the curved upper surface 54. Furthermore, since the lift springs 76 are compressed and the floating ring 72 is lowered, the arms 48 do not have to act against the bias of the lift springs. Wafer 50 may be vertically moved between the access position and the process position without sliding to one side or the other of backplane 42. Since the wafer support pins 74 do not touch the backside of wafer 50 during processing, the pins 74 do not stick to the backside of the wafer even when the process temperature is very high and a layer of material is deposited on the wafer 50. When processing is complete and the backplane 42 is lowered back into the access position, the lift springs raise the floating ring 72 to again move wafer 50 above the backplane surface 54 as pins 74 lift the wafer 50.

Since floating ring 72 is raised and lowered by lift springs 76 and the contact between surfaces 81 and 82, 83, no separate dedicated actuating mechanism is necessary for movement of the floating ring 72 and wafer support pins 74. The elimination of a dedicated actuating mechanism for moving the wafer support pins 74 and wafer 50 is particularly advantageous due to the high temperatures and corrosive environment around the wafer which are often present during processing, such as during sputter etching and which may damage an electrical actuating mechanism. Furthermore, the simple design of the floating ring 72 and the wafer support pins 74 utilized in the wafer support structure 52 of the present invention enables a filler ring 84 to be positioned around backplane 42 between the stationary guide ring 70 and floating ring 72 and the backplane 42 as illustrated in FIGS. 4A, 4B and 4C. Preferably, the floating ring, lift springs and clamping structure are dimensioned such that the floating ring 72 is moved out of contact with the wafer 50 as the wafer is starting to be clamped.

Figure 6A:
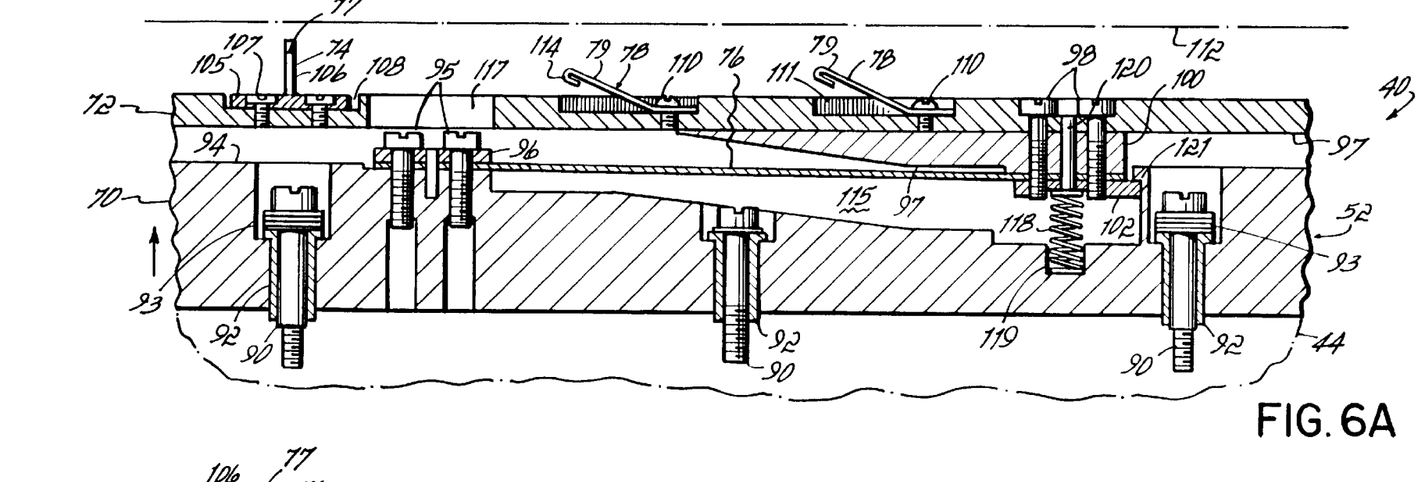
FIG. 6A is a cross-sectional view taken along lines 6—6 of FIG. 5 showing the floating ring of the wafer support structure in a raised position and FIG. 6B is a view as in 6A showing the floating ring in a lowered position.
Figure 6B:
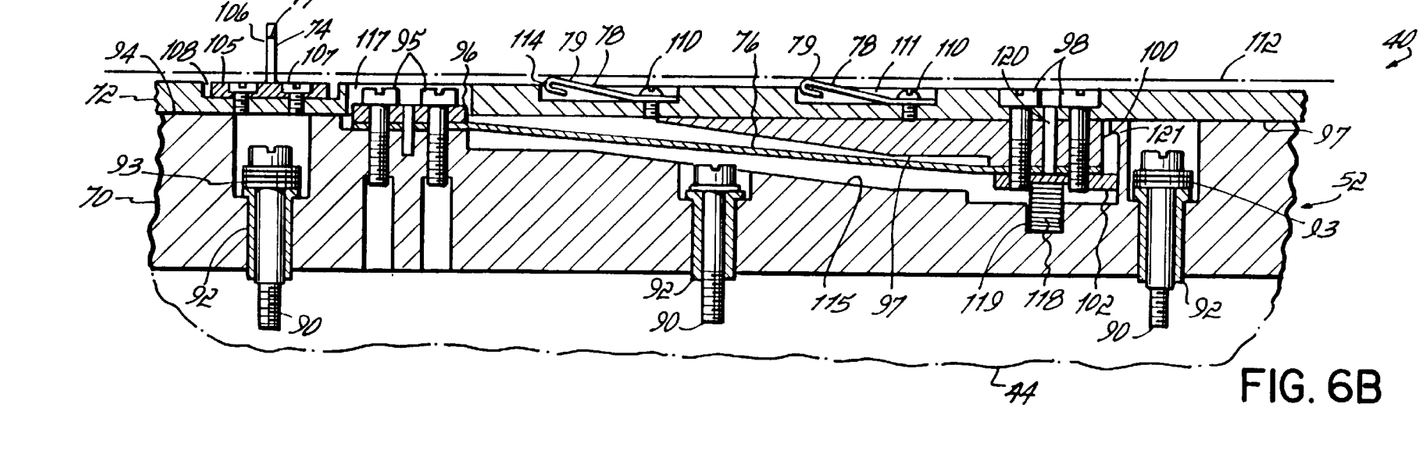

In a preferred embodiment of the present invention, the lift springs 76 and RF bias springs 78 are elongated, flat springs which flex by bending along their length. FIGS. 5, 6A and 6B illustrate the position and operation of the flat lift springs 76 and RF bias springs 78 with respect to floating ring 72. FIG. 5 is a top view of the backplane 42 and wafer support structure 52 which encircles the backplane. Preferably, three arcuate-shaped lift springs 76 are positioned around the circumference of floating ring 72. As illustrated in FIG. 5, the curvature of the lift springs 76 preferably matches the curvature of the floating ring 72 around backplane 42. Floating ring 72 and stationary guide ring 70 are concentrically aligned around the backplane 42 such that the floating ring rests directly above the stationary guide ring. The lift springs 76 are positioned between the floating ring 72 and the stationary guide ring 70. As illustrated in FIGS. 6A and 6B, one end of each lift spring 76 is attached to a lower surface of the floating ring 72 while the other end of the lift spring is attached to an upper surface of the stationary ring 70. The wafer support pins 74 are attached to an upper surface of floating ring 72 and are preferably positioned at equidistant points around the floating ring. The filler ring 84 is also generally concentric with backplane 42 and is positioned between the backplane and the floating ring 72 and stationary guide ring 70. The filler ring 84 makes the space between backplane 42 and support structure 52 very small to prevent a secondary plasma from forming therein. Backplane 42 may contain a gas inlet 86 and gas distribution channels 87 for directing backside heating gas to wafer 50. A gas outlet 88 removes the gas for constant backside heating gas circulation.

Referring now to FIGS. 6A and 6B, stationary guide ring 70 is shown attached to sealing cup 44 by a plurality of screws 90 with accompanying bushings 92 and washers 93 which are positioned around the circumference of the stationary guide ring 70. Floating ring 72 is supported above stationary guide ring 70 by the flat lift springs 76. One end of each of the lift springs is attached to an upper surface 94 of guide ring 70 by two screws 95 which extend through a clamp spacer 96 and into the guide ring 70. Lift spring 76 is a flat, elongated spring which is preferably 0.05 inches thick and 0.43 inches wide. The arcuate length of the lift springs is dependent upon the circumference of floating ring 72 and guide ring 70 which are determined by the size of the backplane 42. For a backplane 42 having a 200 mm diameter, arcuate spring lengths of approximately 2.5 inches have been found to be suitable. The other end of lift spring 76 is attached to a lower surface 97 of the floating ring 72 by screws 98, spacer 100 and nut plate 102.

Figure 7:
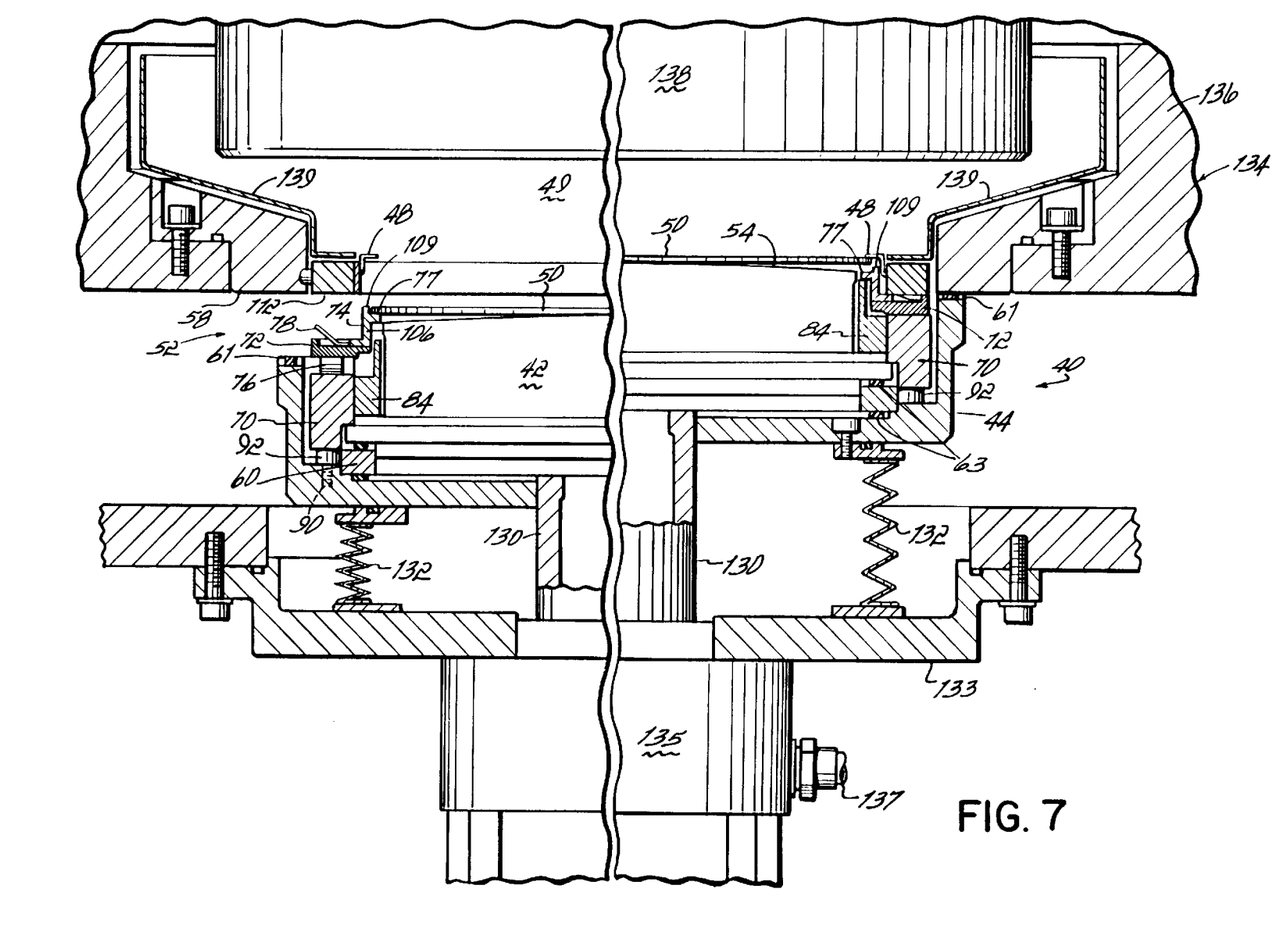
FIG. 7 is a split cross-sectional view of a preferred embodiment of the present invention showing the backplane and wafer support structure alternatively in the wafer access position and the wafer process position.

FIG. 6A illustrates the position of the floating ring when the backplane 42 is in the wafer access position. In the access position, the floating ring 72 is in a raised position and is held by the generally unflexed lift springs 76 spaced above guide ring 70. A ledge 12 formed in the stationary ring 52 limits the height of floating ring 72 (see FIG. 6A). In a raised position, floating ring 72 maintains the uppermost wafer support surfaces 77 of support pins 74 above the backplane surface 54 as is illustrated in FIGS. 4A and 7. Each support pin 74 has a base 105 and a vertical portion 106 which extends upwardly from the base. Base 105 is held to floating ring 72 by screws 107 and the base fits into a groove 108 formed in the top surface of the floating ring 72 to make the base 105 flush with the top surface of floating ring 72. As illustrated in FIG. 7, vertical portion 106 has a raised shoulder 109 adjacent the upper wafer support surface 77 of the pin. The raised shoulder 109 ensures that the wafer 50 does not slide from side to side on the support pins 74 and is thereby contained concentrically over backplane surface 54.

In the access position, the floating ring 72 is maintained generally horizontal to support the wafer 50 in a horizontal position. The unflexed lift springs 76 are also generally horizontal between floating ring 72 and guide ring 70. The RF bias springs 78 are flat and generally tab-shaped (see FIG. 5) and are attached by screws 110 to the floating ring 72 within grooves 111 formed in the top surface of the floating ring. Preferably, two RF bias springs 78 are attached above each lift spring 76 and are—laterally spaced from one another along the arcuate length of the lift spring 76 (see FIG. 5). The tab-shaped RF bias springs 78 are angled upwardly from the plane of the floating ring at an angle approximately in a range of 30° to 35° as shown in FIG. 6A.

When the backplane 42 and wafer support structure 52 are moved into the process position as shown in FIG. 6B, the RF bias springs 78 are directed against the lower surface of the clamping structure 46 as indicated by reference line 112 in FIG. 6B. The RF bias springs 78 preferably have curved ends 114 and are flexed downwardly as guide ring 70 and floating ring 72 are raised against surface 112. The RF springs ensure proper RF biasing of the clamping structure 46. In an alternative embodiment, the RF bias springs may not be utilized. To ensure that the lift springs 76 can fully flex between the floating ring 72 and guide ring 70, a groove 115 is formed in guide ring 70 and preferably has a shape which is complementary to the shape of spacer 100 such that spacer 100 generally seats within groove 115 when the lift springs 76 are flexed and the floating ring 72 is raised and lowered against guide ring 70 to raise and lower wafer 50.

In accordance with the principles of the present invention, the lift springs 76 are elongated such that there is not a large amount of lateral translation of floating ring 72 and support pins 74 when the lift springs are flexed. For example, when the lift springs 76 flex, they generally shorten in lateral length and the combined shortening of each of the lift springs will tend to twist the floating ring 72 in a clockwise direction around the backplane 42 as the floating ring is lowered against guide ring 70. However, the length of the flat lift springs 76 makes such lateral motion very small and thereby reduces the movement of pins 74 against wafer 50 when the wafer is raised and lowered, effectively eliminating any particle generation caused by lift pin abrasions on wafer 50. When spacer 100 seats within groove 115, openings 117 formed within floating ring 72 allow the heads of screws 95 and the clamp spacer 96 to lie generally flush with the top surface of floating ring 72 as illustrated in FIG. 6B.

When floating ring 72 is raised and lowered from the flexing of the lift springs 76, the floating ring 72 may have a tendency to bounce. To prevent such bounce, the present invention utilizes coiled stabilizing springs 118 which are compressed between grooves 119 formed in the guide ring 70 and the head of a roll pin 120 which extends into floating ring 72 through nut plate 102 and spacer 100. The stabilizing spring 118 is flexed when floating ring 72 is lowered and is constantly biased against the end of lift spring 76 attached to the floating ring 72 to minimize any bouncing movement of the floating ring 72. A small ledge 121 formed within guide ring 70 acts against nut plate 102 and ensures that the lift spring 76 is maintained in a horizontal position when floating ring 72 is raised to its uppermost position. This ensures that floating ring 72 is generally horizontal in the raised position when supporting wafer 50 over backplane 42.

The various components of the wafer support structure 52, such as the floating ring 72, guide ring 70, support pins 74, lift springs 76 and stabilizing springs 118 are all preferably stainless steel in order to prevent their corrosion during processing of wafer 50. The wafer support structure 52 in a process position is exposed to the often corrosive processing environment, such as a sputter etching or sputter deposition environment, as illustrated in FIG. 7. The RF bias springs 78 are preferably beryllium copper having a thickness of 0.01 inch and a width of 9/16 inches. The upwardly angled portion 79 of the bias springs is also preferably 9/16 inches in length. RF bias springs 78 preferably have a silverplate 0.005 inch thick and are annealed at 600° F. for three hours for proper stiffness and elasticity characteristics.

FIG. 7 illustrates a wafer support structure 52 of the present invention assembled with a processing chamber 134. A suitable processing chamber and wafer processing apparatus to be utilized with the present invention is the Primus 2500 available from Materials Research Corporation of Orangeburg, N.Y. Backplane 42 and the wafer support structure 52 including guide ring 70 and floating ring 72 are positioned within seal cup 44 which may be aluminum or stainless steel. Seal cup 44 is moved vertically by a conventional air cylinder 130. Bellows 132 surround air cylinder 130 to maintain the integrity of a vacuum introduced within the processing chamber 134. Seal cup 44 and backplane 42 are moved vertically beneath wafer processing chamber 134 which includes a chamber body 136 and a plasma generating apparatus 138 for generating a plasma above wafer 50, such as to sputter etch the wafer. Shields 139 contain the plasma above wafer 50. Cylinder 130 and bellows 132 are supported by platform 133 and cylinder housing 135 which are coupled to a vacuum line (not shown) through a compressed air fitting 137 for introducing a vacuum into the processing chamber 134 when the seal cup 44 and backplane 42 have moved into the process position as illustrated on the right side of FIG. 7.

The left side of FIG. 7 illustrates the support structure 52 of the present invention when the backplane 42 is in the wafer access position. When the backplane 42 is lowered, lift springs 76 maintain the floating ring 72 in a raised position with the wafer support surface 77 and wafer 50 above the curved upper surface 54 of backplane 42. When backplane 42 is moved into the process position, the RF bias springs 78 contact surface 112 of the wafer clamping structure 46 and realize electrical contact, and the floating ring is lowered. When the seal cup 44 is in the process position with sealing gasket 61 securely sealed against chamber surface 58, the floating ring 72 is in the lowered position and the wafer is clamped between clamping arms 48 and backplane surface 54. As illustrated in the right side of FIG. 7, the wafer support pins 74 preferably do not contact the wafer 50 when it is clamped for processing.

As illustrated in FIG. 7, the filler ring 84 is positioned between the guide ring 78 and floating ring 72 and the backplane 42 to fill in the gap around the backplane. Filler ring 84 is configured to reduce the gap and thereby reduce or completely eliminate any secondary plasma which may develop around backplane 42. As shown on the right side of FIG. 7, when the backplane 42 is moved into the process position, the floating ring 72 and filler ring 84 seat together such that there is very little room around the backplane 42 for a secondary plasma to develop. The filler ring 84 illustrated in the Figures is stepped and includes a thin vertical portion 85 which is adjacent the support pins 74 to fill the space adjacent the support pins 74. Filler ring 84 might also be adapted to seat with other differently shaped support pins which are utilized in accordance with the principles of the present invention. By eliminating a secondary plasma around the backplane 42, wafer processing is improved because the process plasma is concentrated above wafer 50 and is not affected by a secondary plasma. Furthermore, the elimination of any secondary plasma proximate the wafer support structure 52 reduces wear and increases the life of the springs, such as lift springs 76 and RF bias springs 78, thereby making the wafer support structure more reliable. Filler ring 84 is also preferably formed of stainless steel.

While the present invention has been illustrated by a description of various embodiments and while these embodiments have been described in considerable detail, it is not the intention of the applicants to restrict or in any way limit the scope of the appended claims to such detail. For example, differently shaped spring structures might be utilized for the floating ring of the invention. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept.

What is claimed is:

1. A wafer support assembly for supporting a wafer and subsequently holding said wafer during processing comprising:

a wafer clamping structure;

a movable backplane positioned for alternate movement toward and away from said clamping structure, the backplane having a process position against the clamping structure for clamping said wafer between an upper surface of the backplane and the clamping structure and an access position spaced away from the clamping structure to allow access to the wafer;

a guide ring surrounding said backplane and vertically movable with the backplane;

a floating ring surrounding said backplane and positioned generally concentrically with said guide ring and above the guide ring, the floating ring including a wafer support positioned above the upper surface of the backplane and configured to support the wafer above and away from said upper surface when the backplane is in said access position;

the floating ring movably mounted on the guide ring and vertically movable alternately toward and away from said guide ring to lower and raise the wafer support, respectively, the floating ring operable to lower the wafer support below said upper surface of the backplane, thereby transferring the wafer to the upper surface of the backplane, when the backplane and guide ring are moved into the processing position to clamp the wafer between said backplane and said clamping structure;

whereby the wafer is stably supported by the wafer support away from the backplane during access of the wafer and is securely clamped between the backplane and the clamping structure away from the wafer support during processing of the wafer.

2. The wafer support assembly of claim 1 wherein said floating ring is mounted to said guide ring by a lift spring for flexible movement with respect to said guide ring, said lift spring, in a generally unflexed position, maintaining the floating ring and wafer support in a raised position above said upper surface of the backplane and operable to flex for lowering the wafer support below said upper surface when the backplane is moved into said processing position.

3. The wafer support assembly of claim 2 further comprising an RF bias spring coupled to a top surface of the floating ring, the RF bias spring contacting a portion of the wafer support assembly to make electrical contact between the floating ring and the wafer support assembly.

4. The wafer support assembly of claim 3 wherein the RF bias spring contacts a portion of said clamping structure to make electrical contact.

5. The wafer support assembly of claim 3 wherein the RF bias spring is a flat spring having one end coupled to said top surface of the floating ring, a free end of the bias spring located above said top surface and contacting a portion of the wafer support assembly when the backplane is moved into the process position.

6. The wafer support assembly of claim 2 wherein the lift spring is an elongated flat spring having one end coupled to a lower surface of the floating ring and another end coupled to an upper surface of the guide ring, the flat spring extending between said guide ring and said floating ring.

7. The wafer support assembly of claim 6 wherein the floating ring is generally circular and the flat lift spring is generally arcuate in shape along its longitudinal axis, the arcuate lift spring coupled to the floating ring so as to follow an arc of the circular floating ring.

8. The wafer support assembly of claim 6 further comprising a stabilizing spring positioned between said floating ring and said guide ring proximate the end of the lift spring coupled to the floating ring, the stabilizing spring acting against the floating ring to prevent bouncing of the floating ring when the backplane is moved.

9. The wafer support assembly of claim 2 further comprising a plurality of lift springs each positioned between the guide ring and floating ring at various points around the rings to provide smooth and level movement of the floating ring with respect to the guide ring.

10. The wafer support assembly of claim 1 further comprising a filler ring surrounding the backplane and positioned between the backplane and the stationary ring.

11. The wafer support assembly of claim 1 further comprising a seal cup surrounding and supporting said backplane, said guide ring and said floating ring, said seal cup being movable toward said clamping structure and configured for sealing the backplane in a processing chamber.

12. The wafer support assembly of claim 1 wherein said floating ring includes support pins projecting upwardly from said floating ring, said pins supporting the wafer at a plurality of positions around the perimeter of the wafer.

13. The wafer support assembly of claim 1 wherein the backplane surface is curved.

14. A wafer support assembly for supporting a wafer and subsequently holding said wafer during processing comprising:

a wafer clamping structure;

a movable backplane positioned for alternate movement toward and away from said clamping structure, the backplane having a process position against the clamping structure for clamping said wafer between an upper surface of the backplane and the clamping structure and an access position spaced away from the clamping structure to allow access to the wafer;

a floating ring surrounding said backplane, the floating ring including a wafer support positioned above the backplane upper surface and configured to support the wafer above and away from said upper surface when the backplane is in said access position;

the floating ring movably coupled with the backplane and vertically movable to alternately lower and raise the wafer support, the floating ring operable to lower the wafer support below said upper surface of the backplane, thereby transferring the wafer to the upper surface of the backplane, when the backplane is moved into the process position to clamp the wafer between said backplane and said clamping structure;

whereby the wafer is stably supported by the wafer support away from the backplane during access of the wafer and is securely clamped between the backplane and the clamping structure away from the wafer support during processing of the wafer.

15. The wafer support assembly of claim 14 wherein said floating ring is mounted on an elongated flat lift spring extending below said floating ring, said lift spring having one end coupled to a lower surface of the floating ring and, when generally unflexed, maintaining the floating ring in a raised position with the wafer support above said upper surface of the backplane and operable to flex for lowering the floating ring wafer support below said upper surface when the backplane is moved into said process position.

16. The wafer support assembly of claim 15 further comprising a plurality of lift springs each positioned at one of various points around the floating ring to provide smooth and level movement of the floating ring to raise and lower the wafer support with respect to the backplane.

17. The wafer support assembly of claim 15 wherein the floating ring is generally circular and the lift spring is generally arcuate in shape along its longitudinal axis, the arcuate lift spring coupled to the floating ring so as to follow an arc of the circular floating ring.

18. The wafer support assembly of claim 14 further comprising a flat RF bias spring having one end coupled to a top surface of the floating ring, a free end of the bias spring located above said top surface and contacting a portion of the wafer support assembly to provide electrical contact between the floating ring and the assembly when the backplane is moved into the process position to thereby lower the wafer support.

19. The wafer support assembly of claim 14 wherein the backplane surface is curved.

20. A wafer support structure for use with a wafer clamping structure and a backplane movable between a process position in which a wafer is clamped between an upper surface of the backplane and the clamping structure and an access position in which the backplane and wafer are spaced away from the clamping structure, the wafer support structure comprising:

a wafer support positioned above the upper surface of the backplane and configured to support the wafer above and away from said upper surface when the backplane is in said access position;

the wafer support operably movable with respect to the backplane to alternately lower and raise the wafer as the backplane is moved between the access and process positions, the wafer support operable to lower the wafer and transfer the wafer to the backplane upper surface and move out of contact with the wafer when the backplane is moved into the process position to clamp the wafer between said backplane and said clamping structure;

whereby the wafer is stably supported by the wafer support away from the backplane during access of the wafer and is securely clamped between the backplane and the clamping structure away from the wafer support during processing of the wafer.

21. The wafer support structure of claim 20 further comprising a floating ring surrounding said backplane and supporting said wafer support, the floating ring movable with respect to said backplane to raise and lower the wafer support when the backplane is moved between the access and process position.

22. The wafer support structure of claim 21 wherein the wafer support includes a plurality of support pins positioned around the floating ring.

23. The wafer support structure of claim 20 wherein said wafer support is coupled to a lift spring for flexible movement with respect to the backplane, the lift spring, when generally unflexed, maintaining the wafer support in a raised position with the wafer above said backplane upper surface and operable to flex for lowering the wafer onto the backplane upper surface when the backplane is moved into said process position.

24. The wafer support structure of claim 20 further comprising an RF bias spring operable to flex and push the wafer to contact the clamping structure and make electrical contact therewith when the backplane is moved to the process position to transfer the wafer to the backplane upper surface.

25. The wafer support structure of claim 20 wherein the backplane surface is curved.

26. A processing apparatus for processing a substrate wafer comprising:

a processing chamber including a wafer clamping structure positioned in a processing space;

a movable backplane positioned for alternate movement toward and away from said processing space, the backplane having a process position against the clamping structure for clamping said wafer between an upper surface of the backplane and the clamping structure and an access position spaced away from said processing space and said clamping structure to allow access to the wafer;

a floating ring surrounding said backplane, the floating ring including a wafer support positioned above the upper surface of the backplane and configured to support the wafer above and away from said upper surface when the backplane is in said access position;

the floating ring movably coupled with the backplane and vertically movable to alternately lower and raise the wafer support, the floating ring operable to lower the wafer support below said backplane upper surface, thereby transferring the wafer to the backplane upper surface, when the backplane is moved into the process position to clamp the wafer between said backplane and said clamping structure in the processing space;

whereby the wafer is stably supported by the wafer support away from the backplane during access of the wafer and is securely clamped between the backplane and the clamping structure away from the wafer support during processing of the wafer in the processing space.

27. The processing apparatus of claim 26 wherein said floating ring is mounted on an elongated flat lift spring extending below said floating ring, said lift spring having one end coupled to a lower surface of the floating ring and, when generally unflexed, maintaining the floating ring in a raised position with the wafer support above said backplane upper surface and operable to flex for lowering the floating ring wafer support below said upper surface when the backplane is moved into said process position.

28. The processing apparatus of claim 27 further comprising a plurality of lift springs each positioned at one of various points around the floating ring to provide smooth and level movement of the floating ring to raise and lower the wafer support with respect to the backplane.

29. The processing apparatus of claim 26 wherein the floating ring is generally circular and the lift spring is generally arcuate in shape along its longitudinal axis, the arcuate lift spring coupled to the floating ring so as to follow an arc of the circular floating ring.

30. The processing apparatus of claim 26 further comprising a flat RF bias spring having one end coupled to a top surface of the floating ring, a free end of the RF bias spring located above said top surface and contacting a portion of the processing chamber to provide electrical contact between the floating ring and the processing chamber portion when the backplane is moved into the process position to thereby lower the wafer support.

31. The processing apparatus of claim 26 wherein the backplane surface is curved.

32. A method of supporting a substrate wafer during access and processing of the wafer comprising:

supporting the wafer on a wafer support above an upper surface of a movable backplane;

moving the backplane toward a clamping structure to clamp the wafer between the clamping structure and backplane surface;

lowering the wafer support with respect to the backplane surface when the backplane is moved toward the clamping structure, the wafer support being lowered below the backplane surface for transferring the wafer to said surface prior to the wafer being clamped and the wafer support moving out of contact with the wafer when it is clamped;

whereby the wafer is stably supported by the wafer support away from the backplane to be accessed and is securely clamped between the backplane surface and clamping structure away from the wafer support to be processed.

33. The method of claim 32 wherein the upper surface of the movable backplane is curved.

34. The method of claim 32 further comprising:

mounting said wafer support on a floating ring movably mounted around the backplane; and lowering the floating ring to lower the wafer support when the backplane is moved to clamp the wafer.

35. The method of claim 34 wherein said floating ring is spring-mounted on a lift spring around the backplane, the method further comprising pushing downwardly on the floating ring to flex the lift spring and lower the floating ring and wafer support when the backplane is moved to clamp the wafer.

36. The method of claim 35 further comprising pushing downwardly on the floating ring with a portion of the clamping structure when backplane is moved.

37. The method of claim 35 further comprising pushing upwardly on the floating ring with a stabilizing spring when the lift spring is flexed for preventing bouncing of the lift spring and the wafer support.

38. The method of claim 34 further comprising positioning a filler ring around the backplane and between the backplane and the wafer support to effectively eliminate the formation of a secondary plasma around the backplane when the wafer is processed in a plasma.

* * * * *